United States Patent
Nguyen et al.

(10) Patent No.: US 7,428,915 B2
(45) Date of Patent: Sep. 30, 2008

(54) O-RINGLESS TANDEM THROTTLE VALVE FOR A PLASMA REACTOR CHAMBER

(75) Inventors: Andrew Nguyen, San Jose, CA (US);
Hiroji Hanawa, Sunnyvale, CA (US);
Kenneth S. Collins, San Jose, CA (US);
Kartik Ramaswamy, San Jose, CA (US); Amir Al-Bayati, San Jose, CA (US); Biagio Gallo, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 498 days.

(21) Appl. No.: 11/115,956

(22) Filed: Apr. 26, 2005

(65) Prior Publication Data

US 2006/0237136 A1   Oct. 26, 2006

(51) Int. Cl.
*F16K 11/052* (2006.01)

(52) U.S. Cl. .................... 137/601.17; 251/117; 251/305

(58) Field of Classification Search ............ 137/601.17; 251/117, 305
See application file for complete search history.

(56) References Cited

U.S. PATENT DOCUMENTS

| | | | | |
|---|---|---|---|---|
| 2,344,138 A | | 3/1944 | Drummond | 117/107 |
| 3,109,100 A | | 10/1963 | Gecewicz | 250/219 |
| 3,234,966 A | * | 2/1966 | Klose | 137/625.3 |
| 3,298,677 A | * | 1/1967 | Anderson | 261/62 |
| 3,576,685 A | | 4/1971 | Swann et al. | 148/187 |
| 3,897,524 A | * | 7/1975 | Freismuth et al. | 137/601.17 |
| 3,907,616 A | | 9/1975 | Wiemer | 148/188 |
| 4,116,791 A | | 9/1978 | Zega | 204/192 |
| 4,294,205 A | * | 10/1981 | Iiyama et al. | 251/305 |

(Continued)

FOREIGN PATENT DOCUMENTS

EP     0 546 852 A1     6/1993

(Continued)

OTHER PUBLICATIONS

Van de Ven, Evert P., Connick, I-Wen, and Harrus, Alain S., "Advantages of Dual Frequency PECVD for Deposition of ILD and Passivation Films", *IEEE*, Proceedings of VMIC Conference, Jun. 12-13, 1990, pp. 194-201.

Zhnag, B.C., and Cross, R.C., "A high power radio frequency transformer for plasma production," *Rev. Sci. Instrum.*, vol. 69, No. 1, pp. 101-108, Jan. 1998.

(Continued)

*Primary Examiner*—Stephen M Hepperle
(74) *Attorney, Agent, or Firm*—Law Office of Robert M. Wallace

(57) ABSTRACT

A valve system having high maximum gas flow rate and fine control of gas flow rate, includes a valve housing for blocking gas flow through a gas flow path, a large area opening through said housing having a first arcuate side wall and a small area opening through said housing having a second arcuate side wall, and respective large area and small area rotatable valve flaps in said large area and small area openings, respectively, and having arcuate edges congruent with said first and second arcuate side walls, respectively and defining therebetween respective first and second valve gaps. The first and second valve gaps are sufficiently small to block flow of a gas on one side of said valve housing up to a predetermined pressure limit, thereby obviating any need for O-rings.

6 Claims, 4 Drawing Sheets

U.S. PATENT DOCUMENTS

| | | | |
|---|---|---|---|
| 4,382,099 A | 5/1983 | Legge et al. | 427/34 |
| 4,385,946 A | 5/1983 | Finegan et al. | 148/175 |
| 4,434,036 A | 2/1984 | Hoerschelmann et al. | 204/164 |
| 4,465,529 A | 8/1984 | Arima et al. | 148/188 |
| 4,481,229 A | 11/1984 | Suzuki et al. | 427/38 |
| 4,500,563 A | 2/1985 | Ellenberger et al. | 427/38 |
| 4,521,441 A | 6/1985 | Flowers | 427/38 |
| 4,539,217 A | 9/1985 | Farley | 427/10 |
| 4,565,588 A | 1/1986 | Seki et al. | 148/186 |
| 4,698,104 A | 10/1987 | Barker et al. | 437/141 |
| 4,764,394 A | 8/1988 | Conrad | 427/38 |
| 4,778,561 A | 10/1988 | Ghanbari | 156/643 |
| 4,867,859 A | 9/1989 | Harada et al. | 304/298 |
| 4,871,421 A | 10/1989 | Ogle et al. | 156/643 |
| 4,892,753 A | 1/1990 | Weng et al. | 427/38 |
| 4,912,065 A | 3/1990 | Mizuno et al. | 437/141 |
| 4,937,205 A | 6/1990 | Nakayama et al. | 437/165 |
| 4,948,458 A | 8/1990 | Ogle | 156/643 |
| 5,040,046 A | 8/1991 | Chhabra et al. | 357/54 |
| 5,061,838 A | 10/1991 | Lane et al. | 219/121.59 |
| 5,074,456 A | 12/1991 | Degner et al. | 228/121 |
| 5,106,827 A | 4/1992 | Borden et al. | 505/1 |
| 5,107,201 A | 4/1992 | Ogle | 324/72.5 |
| 5,270,250 A | 12/1993 | Murai et al. | 437/165 |
| 5,277,751 A | 1/1994 | Ogle | 156/643 |
| 5,288,650 A | 2/1994 | Sandow | 437/24 |
| 5,290,382 A | 3/1994 | Zarowin et al. | 156/345 |
| 5,312,778 A | 5/1994 | Collins et al. | 437/225 |
| 5,354,381 A | 10/1994 | Sheng | 118/723 |
| 5,435,881 A | 7/1995 | Ogle | 156/345 |
| 5,505,780 A | 4/1996 | Dalvie et al. | 118/723 |
| 5,514,603 A | 5/1996 | Sato | 437/16 |
| 5,520,209 A | 5/1996 | Goins et al. | 137/246 |
| 5,542,559 A | 8/1996 | Kawakami et al. | 216/67 |
| 5,561,072 A | 10/1996 | Saito | 437/24 |
| 5,569,363 A | 10/1996 | Bayer et al. | 204/192.32 |
| 5,572,038 A | 11/1996 | Sheng et al. | 250/492.21 |
| 5,587,038 A | 12/1996 | Cecchi et al. | 156/345 |
| 5,627,435 A | 5/1997 | Jansen et al. | 315/111.21 |
| 5,643,838 A | 7/1997 | Dean et al. | 437/238 |
| 5,648,701 A | 7/1997 | Hooke et al. | 315/111.21 |
| 5,653,811 A | 8/1997 | Chan | 118/723 |
| 5,654,043 A | 8/1997 | Shao et al. | 427/527 |
| 5,660,895 A | 8/1997 | Lee et al. | 427/579 |
| 5,674,321 A | 10/1997 | Pu et al. | 118/723 |
| 5,683,517 A | 11/1997 | Shan | 118/723 |
| 5,711,812 A | 1/1998 | Chapek et al. | 118/723 |
| 5,718,798 A | 2/1998 | Deregibus | 156/429 |
| 5,770,982 A | 6/1998 | Moore | 333/32 |
| 5,888,413 A | 3/1999 | Okumura et al. | 216/68 |
| 5,897,752 A | 4/1999 | Hong et al. | 204/192.12 |
| 5,911,832 A | 6/1999 | Denholm et al. | 118/723 |
| 5,935,077 A | 8/1999 | Ogle | 600/504 |
| 5,944,942 A | 8/1999 | Ogle | 156/345 |
| 5,948,168 A | 9/1999 | Shan et al. | 118/723 |
| 5,985,742 A | 11/1999 | Henley et al. | 438/515 |
| 5,994,207 A | 11/1999 | Henley et al. | 438/515 |
| 5,994,236 A | 11/1999 | Ogle | 48/728 |
| 5,998,933 A | 12/1999 | Shun'ko | 315/11.51 |
| 6,000,360 A | 12/1999 | Koshimuzu | 118/723 |
| 6,013,567 A | 1/2000 | Henley et al. | 438/513 |
| 6,020,592 A | 2/2000 | Liebert et al. | 250/492.21 |
| 6,041,735 A | 3/2000 | Murzin et al. | 118/723 |
| 6,050,218 A | 4/2000 | Chen et al. | 118/723 |
| 6,076,483 A | 6/2000 | Shintani et al. | 118/723 |
| 6,096,661 A | 8/2000 | Ngo et al. | 438/788 |
| 6,101,971 A | 8/2000 | Denholm et al. | 118/723 |
| 6,103,599 A | 8/2000 | Henley et al. | 438/459 |
| 6,132,552 A | 10/2000 | Donohoe et al. | 156/345 |
| 6,150,628 A | 11/2000 | Smith et al. | 219/121.54 |
| 6,153,524 A | 11/2000 | Henley et al. | 438/691 |
| 6,155,090 A | 12/2000 | Rubenson | 70/367 |
| 6,164,241 A | 12/2000 | Chen et al. | 118/723 |
| 6,165,376 A | 12/2000 | Miyake et al. | 216/67 |
| 6,174,450 B1 | 1/2001 | Patrick et al. | 216/61 |
| 6,174,743 B1 | 1/2001 | Pangrle et al. | 438/14 |
| 6,182,604 B1 | 2/2001 | Goeckner et al. | 118/723 |
| 6,187,110 B1 | 2/2001 | Henley et al. | 148/33.2 |
| 6,207,005 B1 | 3/2001 | Henley et al. | 156/345 |
| 6,237,527 B1 | 5/2001 | Kellerman et al. | 118/723 |
| 6,239,553 B1 | 5/2001 | Barnes et al. | 315/111.51 |
| 6,248,642 B1 | 6/2001 | Donlan et al. | 438/407 |
| 6,265,328 B1 | 7/2001 | Henley et al. | 438/782 |
| 6,291,313 B1 | 9/2001 | Henley et al. | 438/458 |
| 6,291,939 B1 | 9/2001 | Nishida | 438/407 |
| 6,300,643 B1 | 10/2001 | Fang et al. | 250/492.21 |
| 6,303,519 B1 | 10/2001 | Hsiao et al. | 438/758 |
| 6,305,316 B1 | 10/2001 | DiVergilio et al. | 118/723 |
| 6,335,536 B1 | 1/2002 | Goeckner et al. | 250/492.3 |
| 6,339,297 B1 | 1/2002 | Sugai et al. | 315/111.21 |
| 6,341,574 B1 | 1/2002 | Bailey, III et al. | 118/723 |
| 6,348,126 B1 | 2/2002 | Hanwa et al. | 156/345 |
| 6,367,772 B1 * | 4/2002 | Glogovcsan, Jr. | 251/305 |
| 6,392,351 B1 | 5/2002 | Shun'ko | 315/111.51 |
| 6,395,150 B1 | 5/2002 | Van Cleemput et al. | 204/192.37 |
| 6,403,453 B1 | 6/2002 | Ono et al. | 438/513 |
| 6,410,449 B1 | 6/2002 | Hanawa et al. | 438/706 |
| 6,413,321 B1 | 7/2002 | Kim et al. | 118/725 |
| 6,417,078 B1 | 7/2002 | Dolan et al. | 438/480 |
| 6,418,874 B1 | 7/2002 | Cox et al. | 118/723 |
| 6,426,015 B1 | 7/2002 | Xia et al. | 216/62 |
| 6,433,553 B1 | 8/2002 | Goeckner et al. | 324/464 |
| 6,453,842 B1 | 9/2002 | Hanawa et al. | 118/723 |
| 6,468,388 B1 | 10/2002 | Hanawa et al. | 156/345.48 |
| 6,494,986 B1 | 12/2002 | Hanawa et al. | 156/345.35 |
| 6,511,899 B1 | 1/2003 | Henley et al. | 438/515 |
| 6,514,838 B2 | 2/2003 | Chan | 438/513 |
| 6,528,391 B1 | 3/2003 | Henley et al. | 438/459 |
| 6,551,446 B1 | 4/2003 | Hanwa et al. | 156/345.48 |
| 6,559,408 B2 | 5/2003 | Smith et al. | 219/121.57 |
| 6,582,999 B2 | 6/2003 | Henley et al. | 438/221 |
| 6,593,173 B1 | 7/2003 | Anc et al. | 438/149 |
| 6,679,981 B1 | 1/2004 | Pan et al. | 204/298.06 |
| 6,854,709 B2 * | 2/2005 | Kawai et al. | 251/288 |
| 2001/0042827 A1 | 11/2001 | Fang et al. | |
| 2002/0047543 A1 | 4/2002 | Sugai et al. | 315/111.21 |
| 2003/0013260 A1 | 1/2003 | Gossman et al. | 438/301 |
| 2003/0085205 A1 | 5/2003 | Lai et al. | 219/121.43 |
| 2003/0122100 A1 * | 7/2003 | Baumann | 251/305 |
| 2004/0149952 A1 * | 8/2004 | DePenning et al. | 251/305 |
| 2005/0072952 A1 * | 4/2005 | Alves | 251/305 |

FOREIGN PATENT DOCUMENTS

| | | |
|---|---|---|
| EP | 0 836 218 A2 | 4/1998 |
| EP | 0 964 074 A2 | 12/1999 |
| EP | 1 111 084 A1 | 6/2001 |
| EP | 1 158 071 A2 | 11/2001 |
| EP | 1 191 121 A1 | 3/2002 |
| JP | 59-86214 | 5/1984 |
| JP | 59-218728 | 12/1984 |
| JP | 62-120041 | 6/1987 |
| JP | 070455542 | 2/1995 |
| JP | 2000150908 | 5/2000 |
| WO | WO 99/00832 | 1/1999 |
| WO | WO 01/11650 A1 | 2/2001 |
| WO | WO 02/25694 A2 | 3/2002 |
| WO | WO 93/18201 | 9/2003 |

OTHER PUBLICATIONS

U.S. Appl. No. 09/638,075, filed Aug. 11, 2000, entitled, "Externally Excited Torroidal Plasma Source," By Hanwa, et al.

* cited by examiner

US 7,428,915 B2

O-RINGLESS TANDEM THROTTLE VALVE FOR A PLASMA REACTOR CHAMBER

BACKGROUND OF THE INVENTION

Most plasma processes for semiconductor circuit fabrication require the plasma reactor chamber to be maintained at a sub-atmospheric pressure using a vacuum pump coupled to the chamber. Typically, the vacuum pump is operated at a nominal constant rate, while the chamber pressure is adjusted by a butterfly valve coupled between the chamber and the vacuum pump. The butterfly valve has a rotatable disk-shaped flap whose rotational position determines the flow rate to the vacuum pump and therefore controls the chamber pressure. The valve flap typically has an O-ring around its perimeter that seats on the edge of the valve housing whenever the valve is in the closed position. The O-ring is necessary in order to ensure a seal when the valve flap is in the closed position. The O-ring suffers wear when it is in a slightly opened position at which the desired chamber pressure is achieved. Plasma and gases flowing past the O-ring react with the O-ring material and degrade it or remove it. As a result, the valve must be serviced periodically to replace the O-ring, which entails significant maintenance costs and down-time of the reactor.

Another problem is that there is a trade-off between the maximum flow capacity of the valve and its ability to regulate chamber pressure accurately. The resolution with which pressure can be controlled is roughly inversely proportional to the valve diameter. This is because control of the rotational angle of the valve flap is limited to a minimum angular excursion, depending upon the motor or servo employed to rotate the flap. The minimum angular excursion or resolution may be less than 1 degree. For a very small diameter valve flap and opening, this resolution can afford highly accurate or fine control of the chamber pressure. However, for a larger diameter valve flap or opening, movement of the flap through the minimum angular excursion causes a relatively large change in chamber pressure, so that fine control of chamber pressure is not possible. This problem can be overcome by employing a smaller diameter valve flap and opening. However, such an approach limits the rate at which the chamber can be evacuated or cleaned. For example, cleaning the chamber with NF3 gases with a fast "dump" of the cleaning gases and by-products is not possible with a small diameter valve.

What is desired is a pressure-control valve that has a very high maximum flow rate (maximum opening size) but which, despite the large maximum opening size, can control chamber pressure as accurately as a very small valve, and requires no periodic replacement of an O-ring.

SUMMARY OF THE INVENTION

A valve system having high maximum gas flow rate and fine control of gas flow rate, includes a valve housing for blocking gas flow through a gas flow path, a large area opening through said housing having a first arcuate side wall and a small area opening through said housing having a second arcuate side wall, and respective large area and small area rotatable valve flaps in said large area and small area openings, respectively, and having arcuate edges congruent with said first and second arcuate side walls, respectively and defining therebetween respective first and second valve gaps. The first and second valve gaps are sufficiently small to limit conductance of a gas through said valve housing up to a predetermined pressure limit for a predetermined minimum gas flow limit, thereby obviating any need for O-rings.

DETAILED DESCRIPTION OF THE INVENTION

Figure 1A:
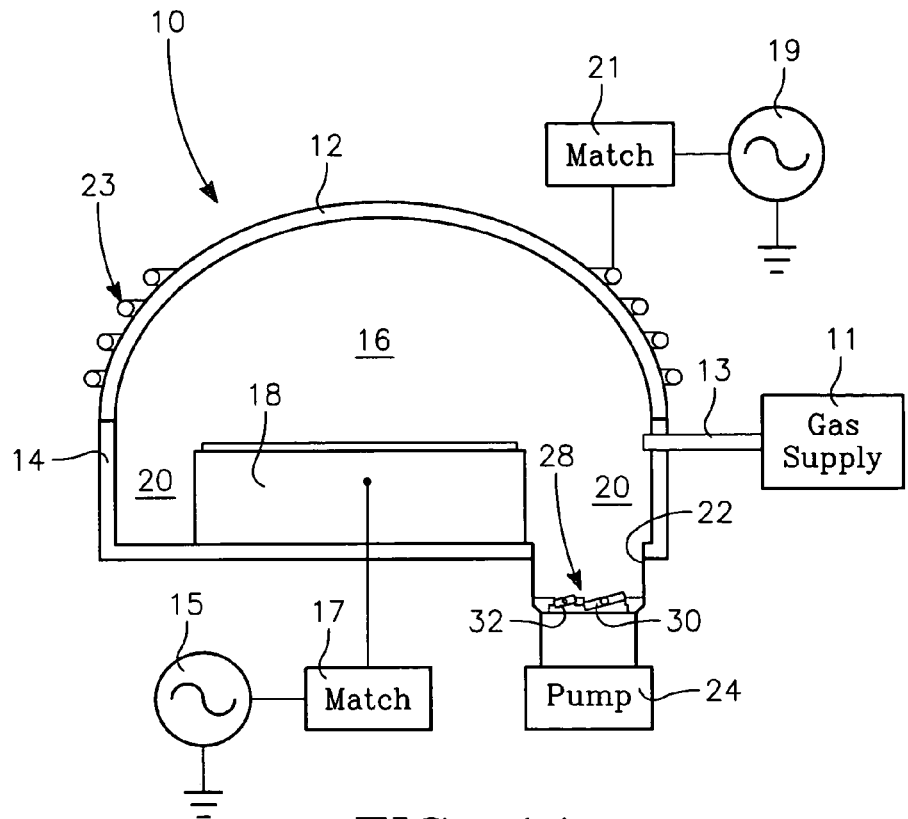
FIG. 1A illustrates a plasma reactor including a valve assembly of the invention.
Figure 1B:
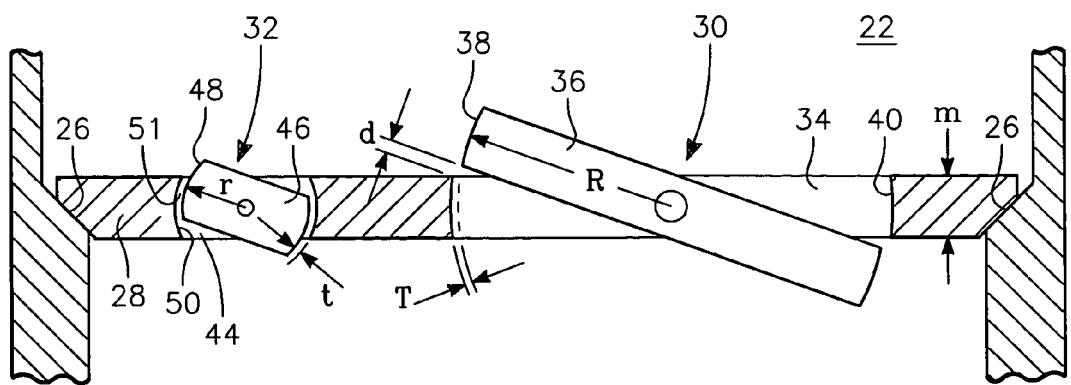
FIG. 1B is an enlarged cross-sectional side view of a valve in the valve assembly of FIG. 1A.

Referring to FIGS. 1A and 1B, a plasma reactor 10 has a ceiling 12 and sidewall 14 enclosing a vacuum chamber 16 with a wafer support pedestal 18 inside the chamber 16 for holding a silicon wafer to be processed. A process gas supply 11 furnishes process gas or a process gas mixture into the chamber 16 through gas injection apparatus 13. Plasma bias power is applied from a RF bias power generator 15 through an impedance match circuit 17 to the wafer pedestal 18. Plasma source power may be applied from an RF source power generator 19 and through an impedance match circuit 21 to a source power applicator 23 (which may be an antenna or an electrode, for example, and may be located at the ceiling 12 or at the pedestal 18). A pumping annulus 20 is defined between the sidewall 14 and pedestal 18. A pumping conduit 22 is coupled between the pumping annulus 20 and an external vacuum pump 24.

The internal surface of the pumping conduit 22 has a shoulder 26 supporting a valve housing 28 extending across the diameter of the pumping conduit 22. The valve housing 28 supports a pair of tandem butterfly valves, namely a large high volume valve 30 and a small fine control valve 32. The high volume valve 30 consists of a circular opening 34 through the valve housing 28 and a rotatable valve flap 36. The valve flap 36 is a flat section of a sphere, and therefore has an arcuate edge 38. The edge 40 of the opening 34 through the valve housing 28 has a similar arcuate shape matching that of the valve flap arcuate edge 38. When the flap 36 is in the closed position (i.e., parallel with the plane of the valve housing 28), the arcuate edges 38, 40 define an arcuate gap having a thickness T. The radius of the arcuate gap is sufficiently small so that there is no straight-line path through the arcuate gap from the internal side of the valve to the external side (i.e., from the chamber 16 to the pump 24). This helps limit the rate of gas escaping through the arcuate gap. Preferably, the arcuate gap thickness T is less than the mean free collision path of the gases or plasma in the chamber 16 within a given pressure range. This pressure range may be 2 mT to 200 mT, in one embodiment. In other words, the gap thickness in that embodiment is sufficiently small to be less than the mean free collision path for chamber pressures up to 200 mT. The gap thickness T may be between about 0.010 and 0.030 inch, or lower, for example, depending upon the intended chamber pressure operating range. Coarse control over chamber pressure is obtained by controlling the rotational position of the high volume valve flap 36, which determines the valve opening size d (FIG. 1B). With such a small gap and a circular path through the gap, the rate at which process gases or plasma products escape through the gap is low. This feature obviates the need for any O-ring to seal the gap, a significant advantage.

Conductance of the high volume valve 30 is determined by the valve opening size d, which is monotonically related to the angular or rotational position of the valve flap 36 (for angular position range of 0 degree (closed) up to 90 degree (wide open)). The conductance and gas flow rate determines the chamber pressure, and therefore chamber is regulated by controlling the valve opening size d through rotation of the valve flap 36.

The fine control valve 32 consists of a circular opening 44 through the valve housing 28 and a rotatable valve flap 46. The valve flap 46 is a flat section of a sphere, and therefore has an arcuate edge 48. The edge 50 of the opening 44 through the valve housing 28 has a similar arcuate shape matching that of the valve flap arcuate edge 48. When the flap 46 is in the closed position (i.e., parallel with the plane of the valve housing 28, the arcuate edges 48, 50 define an arcuate gap 51 having a thickness t. The radius of the arcuate gap 51 is sufficiently small so that there is no straight-line path through the arcuate gap 51 from the internal side of the valve to the external side (i.e., from the chamber 16 to the pump 24). This helps limit the rate of gas escaping through the arcuate gap 51.

In accordance with another feature that helps prevent gas escaping through the gap 51, the gap thickness t is less than the mean free collision path of the gases or plasma in the chamber 16 within a given pressure range. This pressure range may be 2 mT to 200 mT, in one embodiment. In other words, the gap thickness t in that embodiment is sufficiently small to be less than the mean free collision path for chamber pressures up to 200 mT. The gap thickness may be about 0.010 to 0.030 inch, for example. Fine control over chamber pressure is obtained by controlling the rotational position of the flap 46, which determines the valve opening size. With such a small gap and a circular path through the gap, the rate at which process gases or plasma products escape through the gap is low. This feature obviates the need for any O-ring to seal the gap, a significant advantage.

Conductance through the valve 32 is determined by the valve opening size, which is monotonically related to the angular or rotational position of the valve flap 46 (for angular position range of 0 degree (closed) up to 90 degree (wide open). The parallel sum of the individual conductances of the respective tandem valves 30, 32 and the gas flow rate determine the chamber pressure, and therefore chamber pressure is regulated by controlling the valve opening size of each valve 30, 32 through rotation of the valve flaps 36 and 46. An advantage of the high volume valve 30 is that extremely large chamber evacuation rates can be attained by rotating the flap 36 of the high volume valve 30 to its fully opened angular position (i.e., perpendicular relative to the plane of the valve housing 28). The high volume valve's diameter may be very large (e.g., 9 inches), to accommodate a large chamber evacuation rate required during chamber cleaning operations using a cleaning gas such as NF3 or using depositing gases during film deposition, for example. However, the high volume valve does not provide the most accurate regulation of chamber pressure to a desired pressure value because small angular rotations of its flap 36 produce large changes in the chamber pressure. Accurate control is provided by the fine control valve 32, whose opening diameter may be as small as one inch (for example). In the case of the fine control valve 32, a small angular rotation of its flap 46 produces a relatively small change in chamber pressure, facilitating small, accurate adjustments in chamber pressure. Moreover, the fine control valve flap 46, due to its small diameter, has a relatively small moment of inertia, which permits a motor of modest torque capability to effect very rapid corrections or changes in the chamber pressure, enhancing the fine control capability of the valve 32.

In operation, the high volume valve 30 is set to a rotational position (or opening size d) that establishes a chamber pressure above the desired chamber pressure by a difference that is sufficiently small to be within the ability of the fine control valve 32 to compensate. The chamber pressure is then accurately adjusted to the exact value of the desired pressure by opening the fine control valve 32 until the chamber pressure has decreased to the desired value. Because the fine control valve 32 has such a small opening, the rotational movement of the fine control valve flap 46 effects very small changes in chamber pressure, thereby facilitating accurate adjustment of the chamber pressure.

Figure 2:
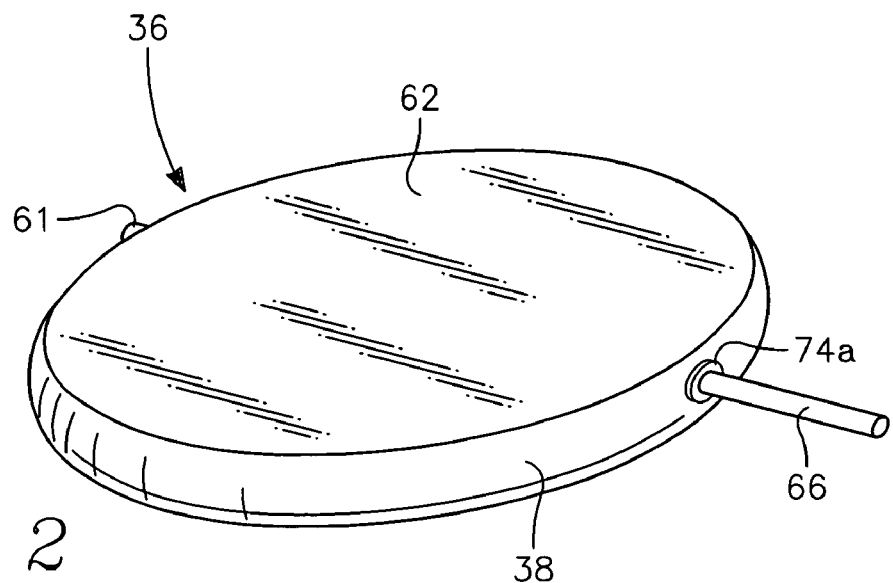
FIG. 2 is a perspective view of the top side of a valve flap in the valve of FIG. 1B.
Figure 3:
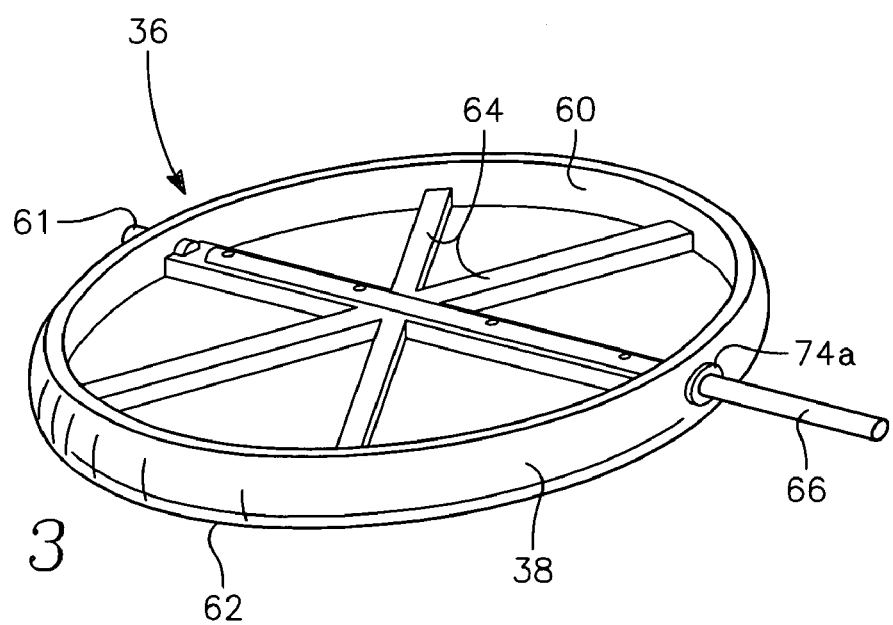
FIG. 3 is a perspective view of the bottom side of the valve flap of FIG. 2.

FIG. 2 shows that one surface of the valve flap 36 facing the chamber 16 (the "plasma" side) is a smooth continuous surface. The perspective view of FIG. 3 shows that the opposite side of the valve flap 36 partially encloses a hollow volume surrounded by a circumferential skirt 60 defining the arcuate edge 38 and extending axially from the planar top surface 62. Radial struts 64 extending through the flap's center between opposite sides of the skirt 60 provide rigidity. An axle or shaft 66 extends partially across the diameter and through one side of the skirt 60. The shaft 66 is overlies and is fastened to one of the radial struts 64. A pin 61 aligned with the shaft 66 extends radially outwardly from the opposite side of the skirt 60. Referring to the cross-sectional view of FIG. 4, a top ring 70 nests in a hollow annulus 72 in the top half of the housing 28. The top ring 70 forms a top half of the arcuate edge 40 while the housing 28 forms the remaining half of the arcuate edge 40. A half-cylindrical shaft hole 28a formed in the valve housing 28 and a matching half-cylindrical shaft hole 28b in the top ring 70 form a cylindrical shaft hole 27 that encloses the shaft 66 when the top ring 70 is bolted in place. A half-cylindrical shaft sleeve 71 overlies the portion of the shaft 66 that extends beyond the top ring 70. In similar manner, a half-cylindrical pin hole 29a formed in the valve housing 28 and a matching half-cylindrical pin hole 29b in the top ring 70 form a cylindrical pin hole 29 that encloses the shaft 66 when the top ring 70 is bolted in place. A pair of teflon spacers 74a, 74b, surrounding the shaft 66 and pin 61, respectively, maintain the axial position of the flap 36 within the valve opening 34. For a gap thickness t on the order of about 0.010 to 0.030 inch, each teflon spacer 74a, 74b has a thickness of about 0.010 inch, for example.

Figure 4:
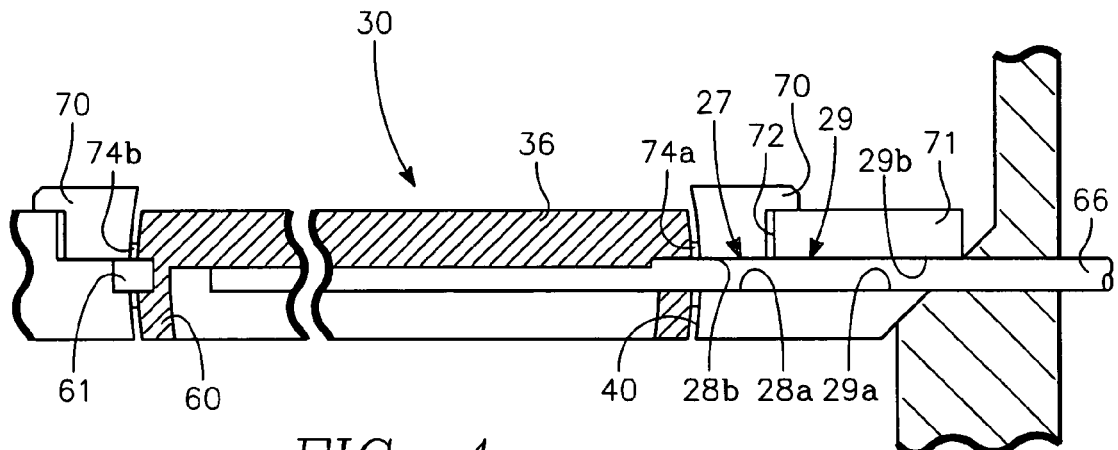
FIG. 4 is a cross-sectional side view of the valve assembly.

The small fine control valve 32 and flap 46 is a smaller but identical version of the larger coarse control valve 30 and flap 36, and therefore has the same structure illustrated in FIGS. 2, 3 and 4, but of reduced size. For example, the fine control valve 32 is about 1/10 the diameter of the coarse control valve 30, in one embodiment.

Figure 5:
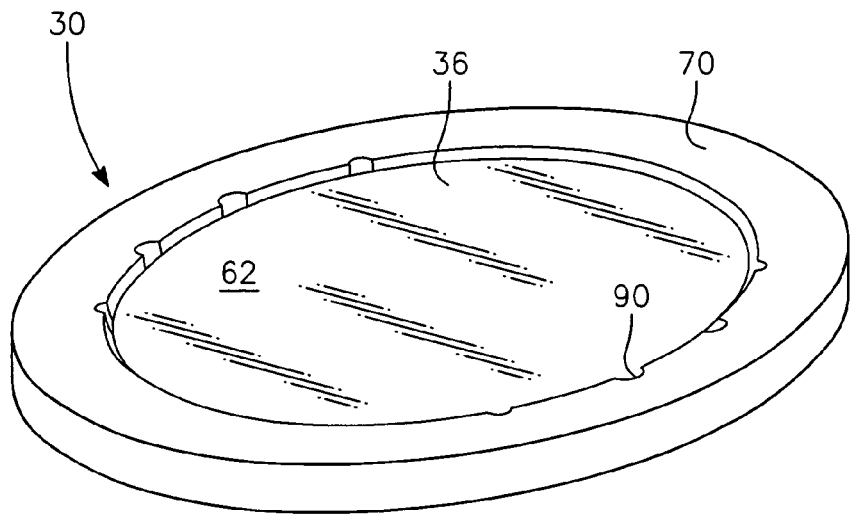
FIG. 5 is a perspective view of a valve flap and housing in the valve assembly of FIG. 4.
Figure 6:
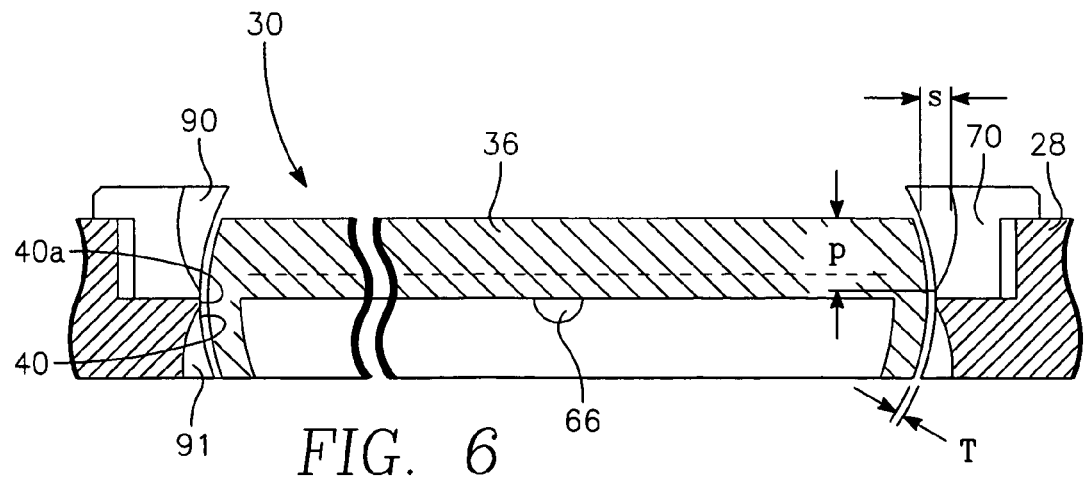
FIG. 6 is a cross-sectional end view of the valve assembly.

One optional feature is to increase the conductance in the high volume valve 30 by forming flow-enhancing slots 90 in the arcuate surface 40 of the valve opening 34, as illustrated in FIGS. 5 and 6. The slots 90 may be arcuate with a radial slot depth s which is maximum depth at the surface of the valve housing 28 and is zero at some depth p below the surface of the housing 28, the slot depth s decreasing with depth below the surface of the housing. The slot depth s reaches zero (so that the slot 90 disappears) at a selected distance p below the surface of the housing 28. A similar slot 91 may extend from the opposite face of the housing 28, tapering in the opposite direction in the same manner as the slot 90. The upper and lower slots 90, 91 are in alignment and may have the same depth p. Their common slot depth p is less than half the thickness of the valve housing 28, so that a surface region 40a of the curved opening surface 40 lies between the two slots 90, 91. The result, as illustrated in FIG. 6, is that when the valve flap 36 is in the closed (parallel) position, there is a gap of the desired thickness T between the periphery of the valve flap 36 and the surface region 40a. The gap thickness T is sufficiently small to limit the rate of leakage of gas or plasma through the valve without requiring an O-ring, as discussed previously in this specification.

The purpose of the slots 90, 91 is to increase the rate at which conductance through the valve grows as the flap is rotated from its closed position. This increase is augmented by increasing the number of slots 90 in the upper housing face and 91 in the bottom housing face.

Figure 7:
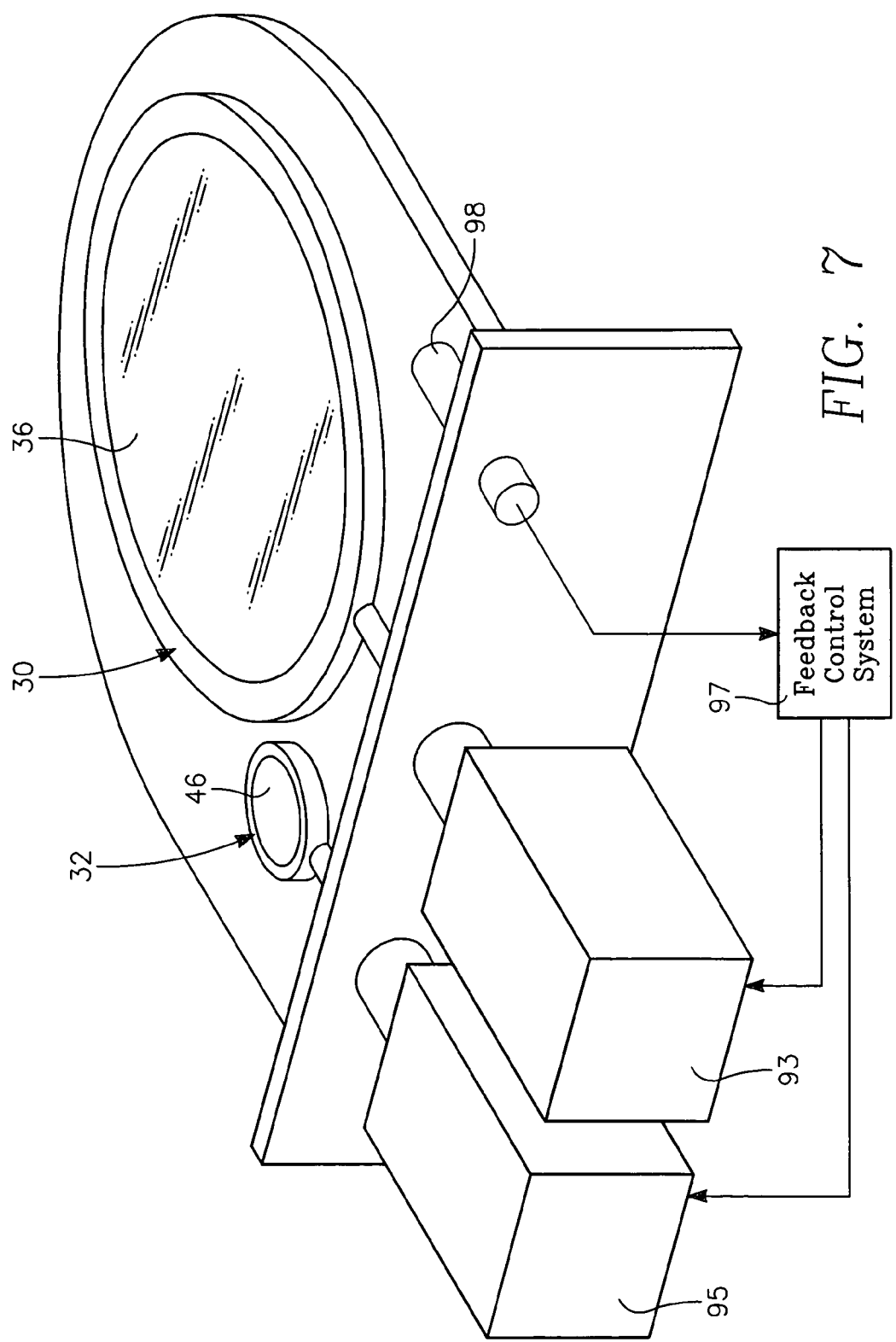
FIG. 7 is a perspective view of the valve system in the reactor of FIG. 1 including the drive motors and feedback control system.

FIG. 7 illustrates how a pair of fast speed positive coupler motors 93, 95 can control the rotation of the respective valve flaps 36, 46. The motors 93, 95 are coupled to the shafts of the valves 30, 32, respectively. A feedback control system 97 compares actual chamber pressure measurements received from a pressure sensor 98 within the chamber with a desired chamber pressure, and controls the positions of the two valves 30, 32 through the motors 93, 95. The control system 97 may be programmed to achieve an approximate match of the actual chamber pressure with the desired value by operating the motor 93, and then achieve exact match between actual and desired chamber pressure by operating the motor 95.

The surfaces of the valve housing and valve flaps facing the plasma reactor are preferably of a material compatible with plasma processing. For some processes, this material may be aluminum. The opposite side of the valve housing and valve flaps facing the vacuum pump, as well as the shaft, may be formed of other materials (e.g., steel or stainless steel). No O-ring is necessary to seal the valve assembly, a significant advantage.

While the invention has been described in detail by reference to preferred embodiments, it is understood that variations and modifications thereof may be made without departing from the true spirit and scope of the invention.

What is claimed is:

1. A valve assembly for controlling one of gas conductance from a plasma reactor chamber to a vacuum pump or chamber pressure, said valve assembly comprising:
    a valve housing having first and second opposing surfaces;
    a high conductance valve comprising:
        a large area opening in said first and second opposing surfaces and extending through said valve housing, said opening defining a side wall extending between said first and second surfaces having an arcuate cross-section,
        a large area rotatable flap in said large area opening having a smooth continuous peripheral edge with an arcuate cross-section generally matching that of said side wall and defining a small gap between said peripheral edge and said side wall in a closed flap position;
    a fine control valve comprising:
        a small area opening in said first and second opposing surfaces and extending through said valve housing, said opening defining a side wall extending between said first and second surfaces having a smooth continuous arcuate cross-section; and
        a small area rotatable flap in said small area opening having a smooth continuous peripheral edge with an arcuate cross-section generally matching that of said side wall and defining a small gap between said peripheral edge and said side wall in a closed flap position;
    first plural axial slots in said side wall of said large area opening comprising round holes of truncated circular cross-section extending from one face of said valve housing and having a radial depth that is maximum at said one face and tapers to a minimum depth at a predetermined distance below said one face, said sidewall of said large area opening having a smooth continuous surface between said axial slots.

2. The apparatus of claim 1 further comprising:
    a controller coupled to said high conductance valve and to said fine control valves, said controller being programmed to effect large flow changes with said high conductance valve and to make fine adjustments of flow rate with said fine control valve.

3. The apparatus of claim 1 wherein each said small gap is sufficiently small to limit gas conductance through said valve assembly within a predetermined pressure range at a predetermined minimum flow rate, wherein said pressure range extends up to about 200 mT and wherein said minimum gas flow rate is about 10 sccm.

4. The apparatus of claim 1 wherein each said small gap is on the order of about twenty thousandths of an inch.

5. The apparatus of claim 1 wherein each said gap is less than the mean collision path length of a gas up to a pressure of 200 mT.

6. The apparatus of claim 1 further comprising second plural slots in said side wall of said large area opening comprising round holes of truncated circular cross-section extending from an opposite face of said valve housing and having a depth that is maximum at said opposite face and tapers to a minimum depth at a predetermined distance below said opposite face.

* * * * *